(12) United States Patent
Kim et al.

(10) Patent No.: US 7,560,388 B2
(45) Date of Patent: Jul. 14, 2009

(54) SELF-ALIGNED PITCH REDUCTION

(75) Inventors: Jisoo Kim, Pleasanton, CA (US);
Sangheon Lee, Sunnyvale, CA (US);
Daehan Choi, Sunnyvale, CA (US); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 304 days.

(21) Appl. No.: 11/291,303

(22) Filed: Nov. 30, 2005

(65) Prior Publication Data

US 2007/0123053 A1    May 31, 2007

(51) Int. Cl.
*H01L 21/311* (2006.01)
(52) U.S. Cl. .................. 438/702; 438/241; 438/275; 438/587; 438/737; 257/E21.683
(58) Field of Classification Search ................. 438/689, 438/700, 702, 703, 737, 738, 740, 743, 744, 438/241, 275, 587; 257/E21.683
See application file for complete search history.

(56) References Cited

U.S. PATENT DOCUMENTS

| | | | |
|---|---|---|---|
| 5,510,645 A | 4/1996 | Fitch et al. |
| 6,232,214 B1 | 5/2001 | Lee et al. |
| 6,297,125 B1 | 10/2001 | Nag et al. |
| 6,605,541 B1 | 8/2003 | Yu et al. |
| 6,780,753 B2 | 8/2004 | Latchford et al. |
| 6,781,192 B2 | 8/2004 | Farrar |
| 6,806,177 B2 | 10/2004 | Strane et al. |
| 6,846,741 B2 | 1/2005 | Cooney, III et al. |
| 6,858,153 B2 | 2/2005 | Bjorkman et al. |
| 6,911,397 B2 | 6/2005 | Jun et al. |
| 7,008,878 B2 | 3/2006 | Hsu et al. |
| 2003/0219988 A1 | 11/2003 | Shan et al. |
| 2003/0232474 A1* | 12/2003 | Lai et al. .................. 438/301 |
| 2003/0232509 A1 | 12/2003 | Chung et al. |
| 2004/0002217 A1 | 1/2004 | Mazur et al. |
| 2004/0072430 A1 | 4/2004 | Huang et al. |
| 2004/0126705 A1 | 7/2004 | Lu et al. |
| 2005/0110145 A1 | 5/2005 | Elers |
| 2006/0121721 A1 | 6/2006 | Lee et al. |
| 2006/0160353 A1 | 7/2006 | Gueneau de Mussy et al. |

(Continued)

OTHER PUBLICATIONS

Office Action dated Dec. 17, 2007 for related U.S. Appl. No. 11/291,672.

(Continued)

*Primary Examiner*—George Fourson
*Assistant Examiner*—John M Parker
(74) *Attorney, Agent, or Firm*—Beyer Law Group LLP

(57) ABSTRACT

A method providing features in a dielectric layer is provided. A sacrificial layer is formed over the dielectric layer. A set of sacrificial layer features is etched into the sacrificial layer. A first set of dielectric layer features is etched into the dielectric layer through the sacrificial layer. The first set of dielectric layer features and the set of sacrificial layer features are filled with a filler material. The sacrificial layer is removed. The widths of the spaces between the parts of the filler material are shrunk with a shrink sidewall deposition. A second set of dielectric layer features is etched into the dielectric layer through the shrink sidewall deposition. The filler material and shrink sidewall deposition are removed.

17 Claims, 10 Drawing Sheets

U.S. PATENT DOCUMENTS

| | | |
|---|---|---|
| 2007/0049017 A1 | 3/2007 | Hsieh |
| 2007/0122977 A1 | 5/2007 | Kim et al. |
| 2007/0123016 A1 | 5/2007 | Sadjadi et al. |
| 2007/0123017 A1 | 5/2007 | Sadjadi et al. |

OTHER PUBLICATIONS

Notice of Allowance dated Feb. 19, 2008 for related U.S. Appl. No. 11/558,238.

International Search Report dated Mar. 27, 2007 from related International Application No. PCT/US2006/044521.

Written Opinion dated Mar. 27, 2007 from related International Application No. PCT/US2006/044521.

International Search Report dated Apr. 24, 2007 from corresponding International Application No. PCT/US2006/044708.

Written Opinion dated Apr. 24, 2007 from corresponding International Application No. PCT/US2006/044708.

International Search Report dated Mar. 20, 2007 from related International Application No. PCT/US2006/044719.

Written Opinion dated Mar. 20, 2007 from related International Application No. PCT/US2006/044719.

U.S. Appl. No. 11/291,411, entitled "Device with Gaps for Capacitance Reduction", by inventors: Sadjadi et al., filed Nov. 30, 2005.

U.S. Appl. No. 11/291,672, entitled "Device with Self Aligned Gaps for Capacitance Reduction", by inventors: Sadjadi et al., filed Nov. 30, 2005.

Notice of Allowance dated May 30, 2008 from U.S. Appl. No. 11/291,672.

Notice of Allowance dated Sep. 24, 2008 from U.S. Appl. No. 11/291,411.

\* cited by examiner

SELF-ALIGNED PITCH REDUCTION

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Various generations of photoresist are known. The photoresist patterns have a critical dimension (CD), which may be the width of the smallest feature. Due to optical properties dependent on wavelength, photoresist exposed by longer wavelength light has larger theoretical minimal critical dimensions. Features are etched through the photoresist pattern. Ideally, the CD of the features (the width of the features) is equal to the CD of the feature in the photoresist. In practice, the CD of the feature may be larger than the CD of the photoresist due to faceting, erosion of the photoresist, or undercutting. The feature may also be tapered, where the CD of the feature is at least as great as the CD of the photoresist, but where the feature tapers to have a smaller width near the feature bottom. Such tapering may provide unreliable features.

In order to provide features with smaller CD, features formed using shorter wavelength light are being pursued. 193 nm photoresist is exposed by 193 nm light. Using phase shift reticles and other technology, a 90-100 nm CD photoresist pattern may be formed, using 193 nm photoresist. This would be able to provide a feature with a CD of 90-100 nm. 157 nm photoresist is exposed by 157 nm light. Using phase shift reticles and other technology sub 90 nm CD photoresist patterns may be formed. This would be able to provide a feature with a sub 90 nm CD.

The use of shorter wavelength photoresists may provide additional problems over photoresists using longer wavelengths. To obtain CD's close to the theoretical limit the lithography apparatus should be more precise, which would require more expensive lithography equipment. Presently 193 nm photoresist and 157 nm photoresist may not have selectivities as high as longer wavelength photoresists and may more easily deform under plasma etch conditions.

In the etching of conductive layers, such as in the formation of memory devices, it is desirable to increase device density

SUMMARY OF THE INVENTION

To achieve the foregoing and in accordance with the purpose of the present invention a method providing features in a dielectric layer is provided. A sacrificial layer is formed over the dielectric layer. A patterned mask is formed over the sacrificial layer. A set of sacrificial layer features is etched into the sacrificial layer. A first set of dielectric layer features is etched into the dielectric layer through the sacrificial layer. The features of the first set of dielectric layer features and the set of sacrificial layer features are filled with a filler material. The sacrificial layer is removed, so that parts of the filler material remain exposed above a surface of the dielectric layer, wherein spaces are between the exposed parts of the filler material, where the spaces are in an area formerly occupied by the sacrificial layer, wherein the spaces have widths. The widths of the spaces between the parts of the filler material are shrunk with a shrink sidewall deposition. A second set of dielectric layer features is etched into the dielectric layer through the shrink sidewall deposition. The filler material and shrink sidewall deposition are removed.

In another manifestation of the invention, a method providing features in a dielectric layer is provided. A sacrificial layer is formed over the dielectric layer. A patterned mask is formed over the sacrificial layer. A set of sacrificial layer features is etched into the sacrificial layer. The sacrificial layer features are shrunk by forming a shrink deposition, comprising at least one cycle, wherein each cycle comprises a shrink deposition phase, which forms deposits on sidewalls of the sacrificial layer features to shrink the sacrificial layer features and a shrink profile shaping phase, which shapes the deposition on the sidewalls of the sacrificial layer features. A first set of dielectric layer features is etched into the dielectric layer through the shrink deposition. The shrink deposition is removed. The features of the first set of dielectric layer features and the set of sacrificial layer features are filled with a filler material. The sacrificial layer is removed, so that parts of the filler material remain exposed above a surface of the dielectric layer, wherein spaces are between the exposed parts of the filler material, where the spaces are in an area formerly occupied by the sacrificial layer, wherein the spaces have widths. The widths of the spaces between the parts of the filler material are shrunk with a shrink sidewall deposition, wherein the shrinking the widths of the spaces comprises at least one shrink cycle, wherein each shrink cycle comprises a shrink deposition phase, which forms deposits on sidewalls of the filler material to shrink the spaces and a shrink profile shaping phase, which shapes the deposition on the sidewalls of the filler material. A second set of dielectric layer features is etched into the dielectric layer through the shrink sidewall deposition. The filler material and shrink sidewall deposition are removed.

In another manifestation of the invention, an apparatus for forming features in a dielectric layer over which a sacrificial layer under a patterned mask has been placed is provided. A plasma processing chamber, comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure is provided. A gas source in fluid connection with the gas inlet and comprises a sacrificial layer etchant source, a dielectric layer etchant source, a shrink deposition gas source, and a shrink profile shaping gas source. A controller controllably is connected to the gas source and the at least one electrode and comprises at least one processor and computer readable media. The computer readable media comprises computer readable code for etching sacrificial layer features into the sacrificial layer without etching the dielectric layer, computer readable code for shrinking the sacrificial layer features with a sacrificial layer sidewall deposition, computer readable code for etching a first set of dielectric features into the dielectric layer through the sacrificial layer sidewall deposition, computer readable code for removing the sacrificial layer sidewall deposition, wherein the features are subsequently filled with a filler material, computer readable code for removing the sacrificial layer, so that parts of the filler material remain exposed above a surface of the dielectric layer, wherein spaces are between the exposed parts of the filler material, computer readable code for shrinking widths of the spaces between parts of the filler material with a shrink deposition, comprising at least one cycle, wherein each cycle comprises computer readable code for providing a shrink deposition gas from the shrink deposition gas source, computer readable code for generating a plasma from the shrink deposition gas, computer readable code for stopping the shrink deposition gas from the shrink deposition gas source, computer readable code for providing a shrink profile shaping gas from the shrink profile shaping gas source, computer readable code for generating a plasma from the shrink profile shaping gas, and computer readable code for stopping the shrink profile shaping gas from the shrink profile shaping gas source, and computer readable code for etching a second set of features into the dielectric layer through the shrink deposition.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

FIG.'s 2A-L are schematic cross-sectional and top views of a stack processed according to an embodiment of the invention.

Figure 3:
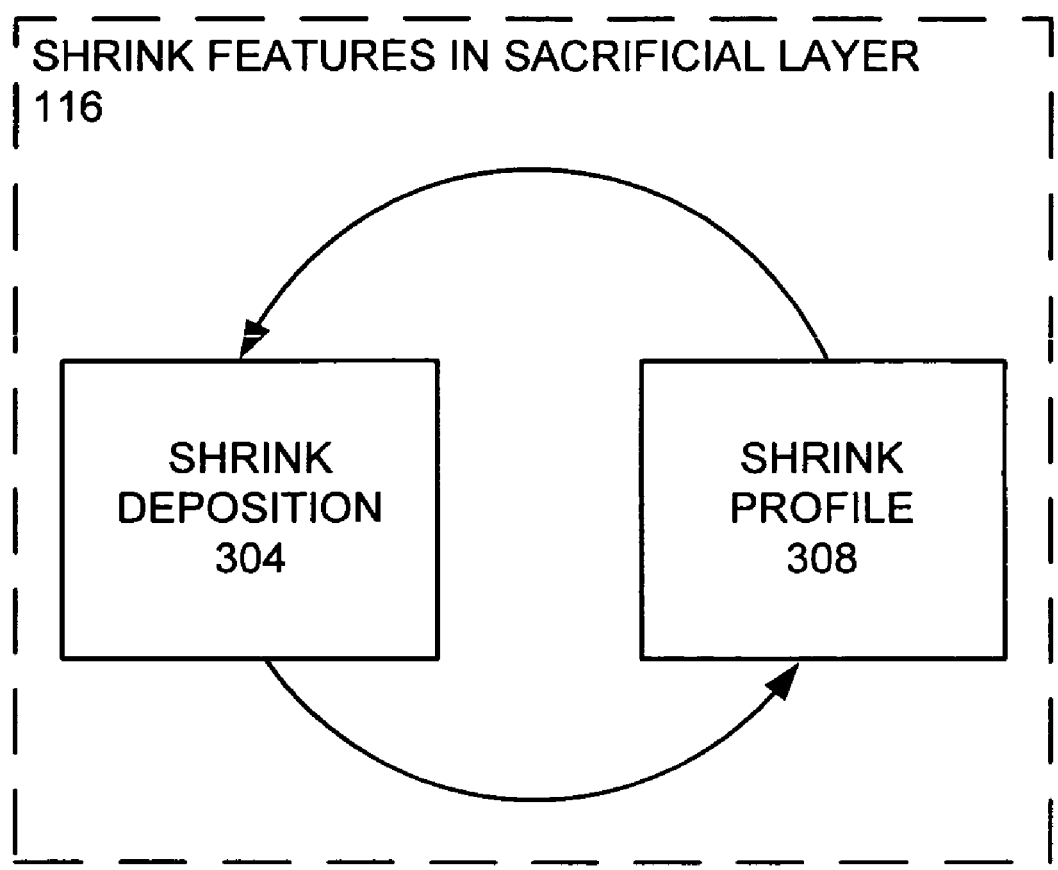

FIG. 3 is a more detailed flow of a step of shrinking features.

Figure 4:
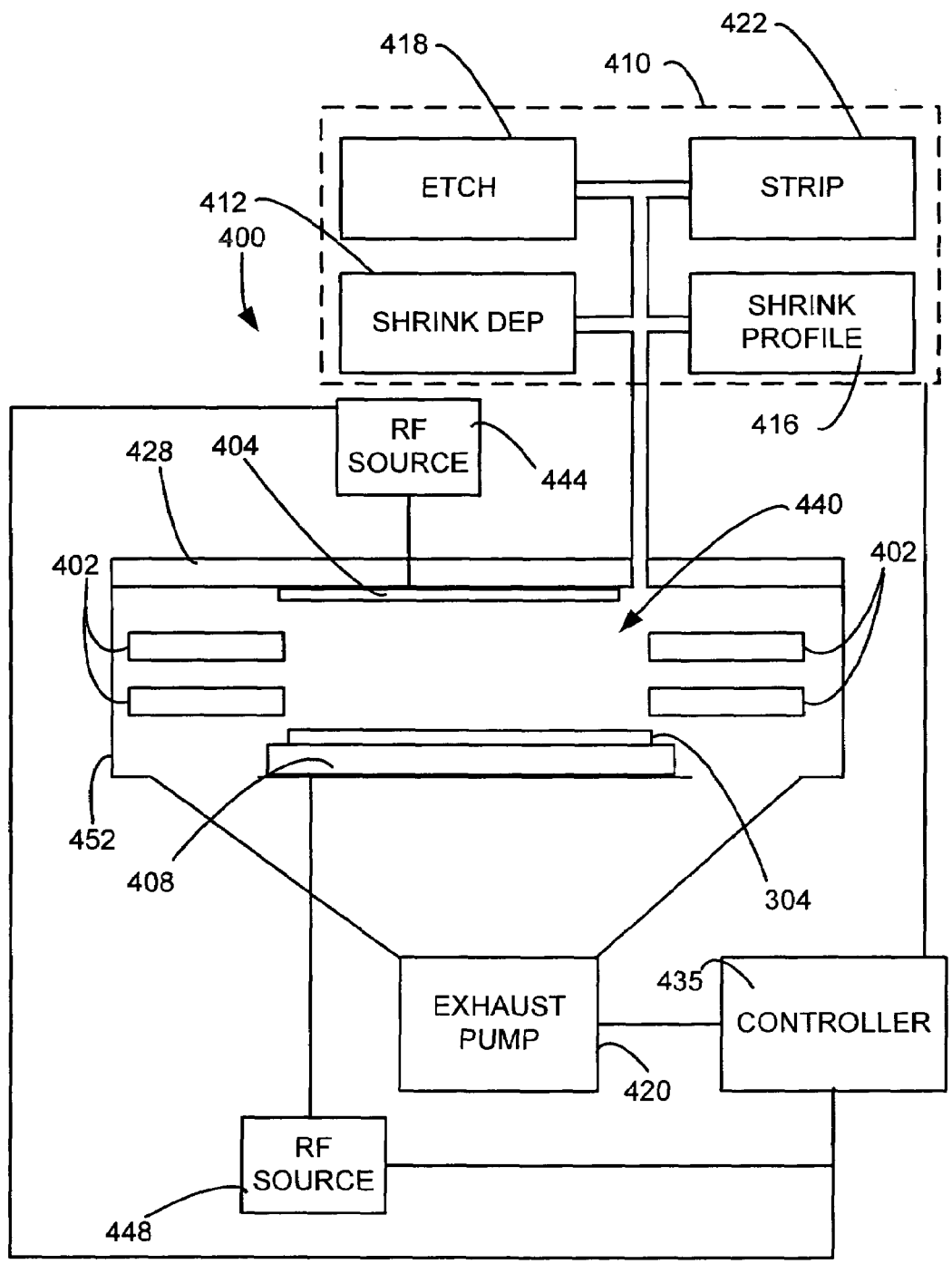

FIG. 4 is a schematic view of a plasma processing chamber that may be used in practicing the invention.

FIGS.'s 5A-B illustrate a computer system, which is suitable for implementing a controller used in embodiments of the present invention.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
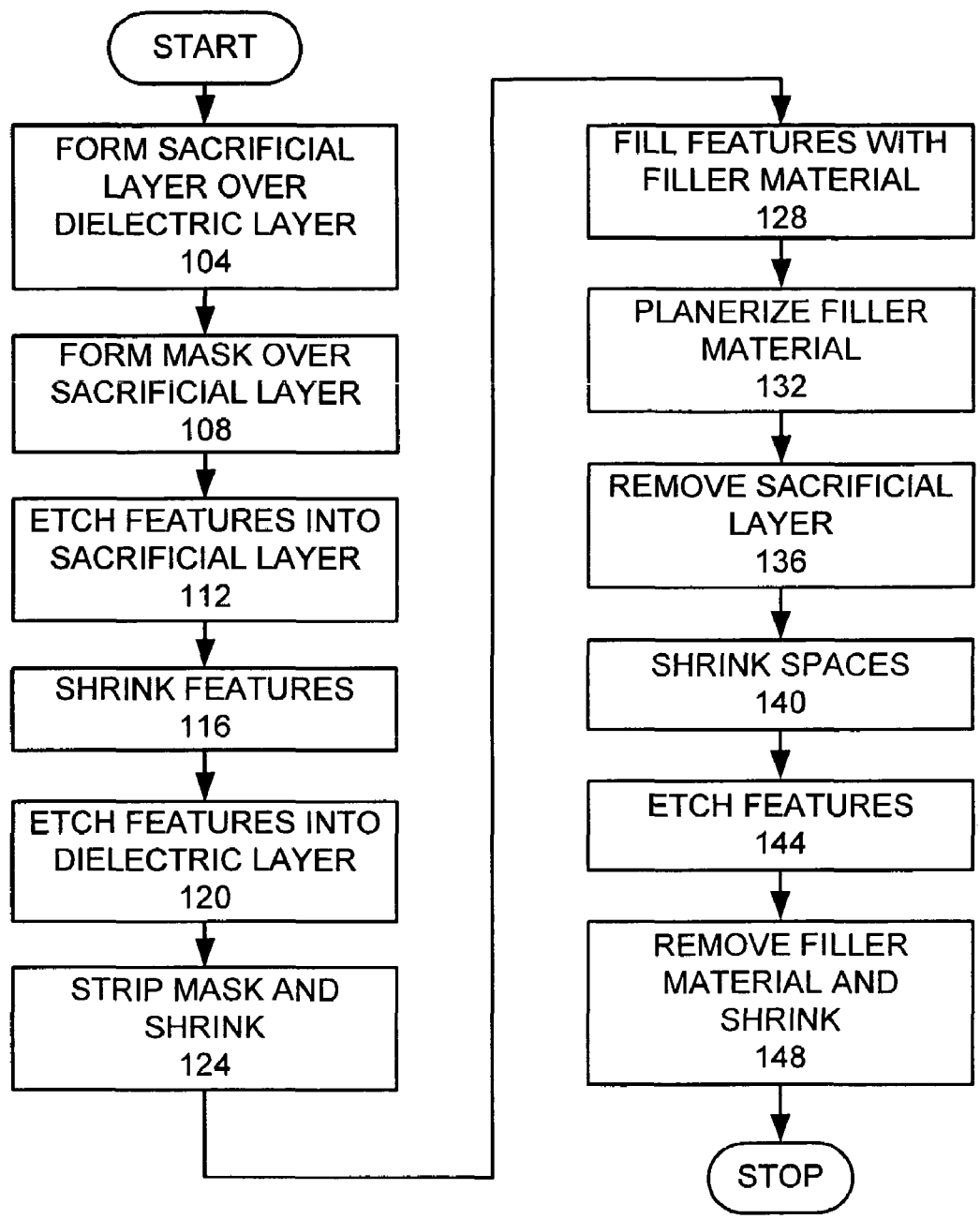
FIG. 1 is a flow chart of a process that may be used in an embodiment of the invention.
Figure 2A:
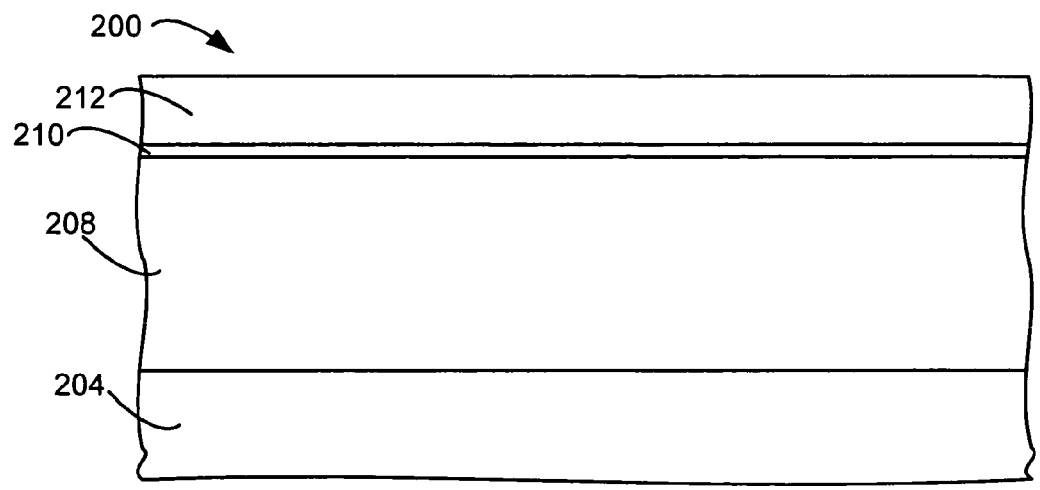

To facilitate understanding, FIG. 1 is a flow chart of a process that may be used in an embodiment of the invention. A sacrificial layer is formed over a dielectric layer (step 104). FIG. 2A is a cross-sectional view of a sacrificial layer 212 formed over a dielectric layer 208, which is over a substrate 204 forming a stack 200. In this example, the substrate 204 is a silicon wafer. An etch stop layer 210 is disposed between the sacrificial layer 212 and dielectric layer 208. In this example, the etch stop layer 210 is at least one of a nitride and silicon carbide. In other examples, the etch stop layer 210 may be of other materials. The dielectric layer 208 is a low-k dielectric, such as organosilicate glass. In this embodiment, the sacrificial layer is silicon oxide. In other embodiments the sacrificial layer is one of SiC, SiN, SiOC, H doped SiOC, TiN, TaN, Ti, Ta, Si, and $SiO_2$. More generally, the sacrificial layer is any material that may be selectively etched or removed with respect to the filling material, described below.

Figure 2B:
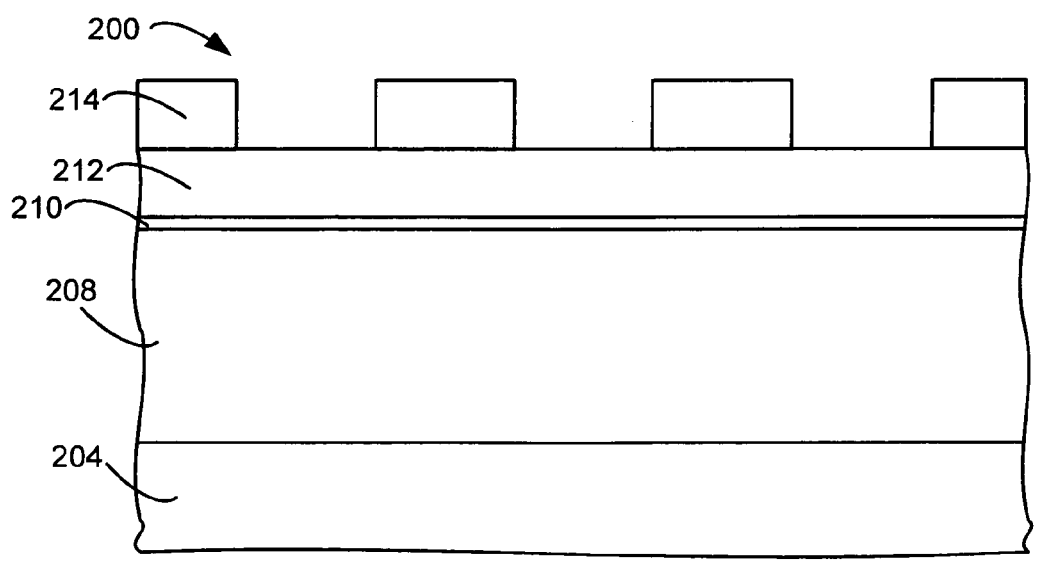
Figure 2C:
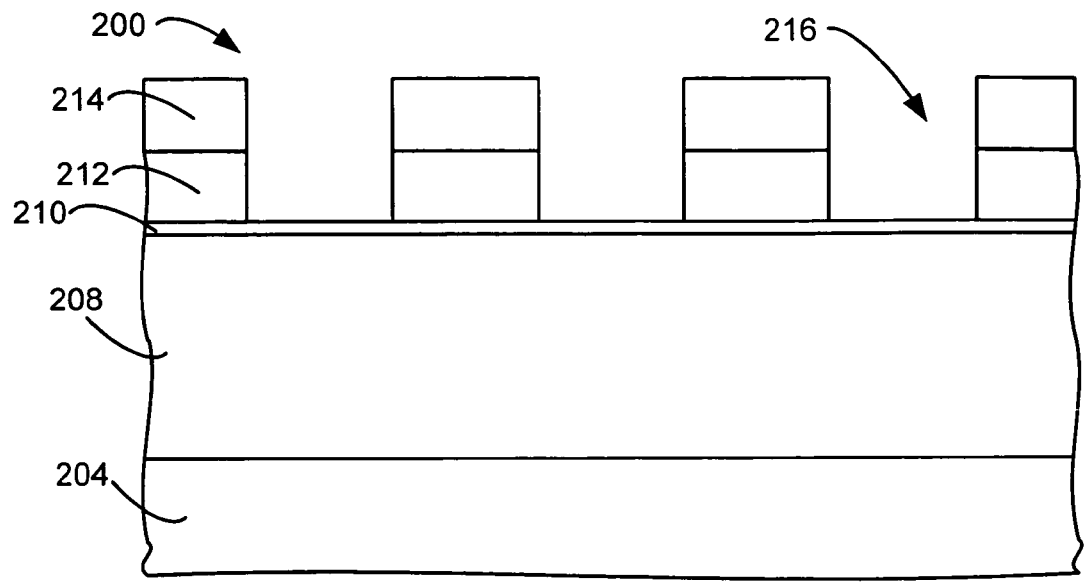
Figure 2D:
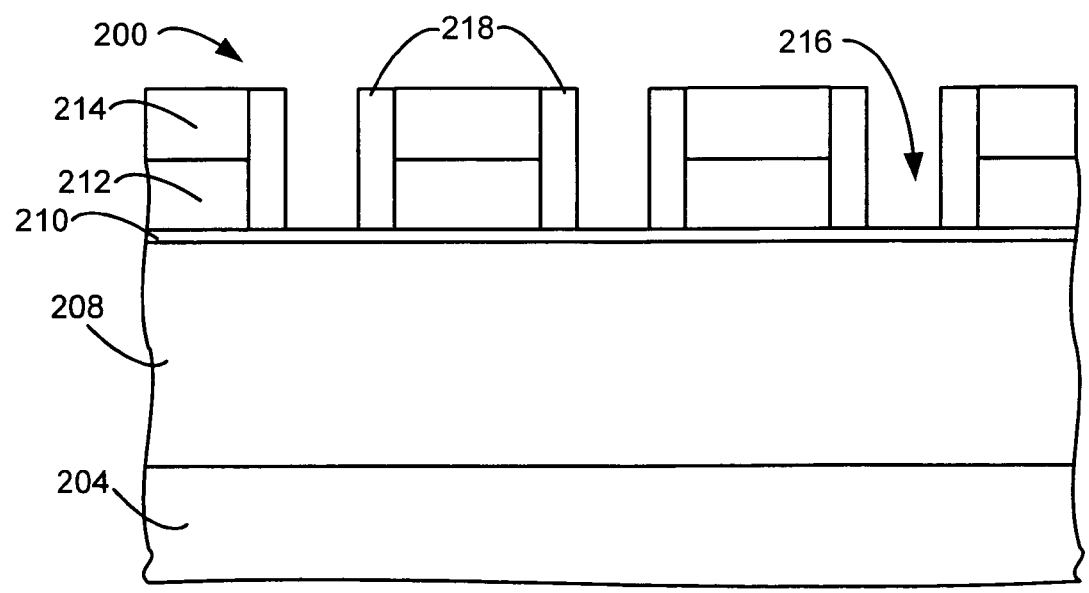

A mask 214 is formed over the sacrificial layer (step 108), as shown in FIG. 2B. Preferably, the mask 214 is of a photoresist material. Sacrificial layer features 216 are etched into the sacrificial layer 212 (step 112), as shown in FIG. 2C. The etch stop layer 210 allows the etching of the sacrificial layer features 216 into the sacrificial layer 212, without etching the dielectric layer 208. After etching the features 216 into the sacrificial layer 212 a shrink process is used to shrink widths of the features 216 in the sacrificial layer 212 by forming sacrificial layer shrink sidewalls 218, as shown in FIG. 2D.

FIG. 4 is a schematic view of a processing chamber 400 that may be used to form the shrink sidewalls. The plasma processing chamber 400 comprises confinement rings 402, an upper electrode 404, a lower electrode 408, a gas source 410, and an exhaust pump 420. The gas source 410 comprises a shrink deposition gas source 412 and a shrink profile gas source 416. The gas source may comprise additional gas sources such as an etch gas source 418 and a stripping gas source 422 to allow etching, stripping, and other processes to be performed in the same chamber. Within plasma processing chamber 400, the substrate 204 is positioned upon the lower electrode 408. The lower electrode 408 incorporates a suitable substrate chucking mechanism (e.g., electrostatic, mechanical clamping, or the like) for holding the substrate 204. The reactor top 428 incorporates the upper electrode 404 disposed immediately opposite the lower electrode 408. The upper electrode 404, lower electrode 408, and confinement rings 402 define the confined plasma volume. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source and a 2 MHz power source. Different combinations of connecting RF power to the electrode are possible. In the case of Lam Research Corporation's Dual Frequency Capacitive (DFC) System, made by LAM Research Corporation™ of Fremont, Calif., which may be used in a preferred embodiment of the invention, both the 27 MHz and 2 MHz power sources make up the second RF power source 448 connected to the lower electrode, and the upper electrode is grounded. In other embodiments, the RF power source may have a frequency up to 300 MHz. A controller 435 is controllably connected to the RF sources 444, 448, exhaust pump 420, and the gas source 410. The DFC System would be used when the layer to be etched 208 is a dielectric layer, such as silicon oxide or organo silicate glass.

Figure 5A:
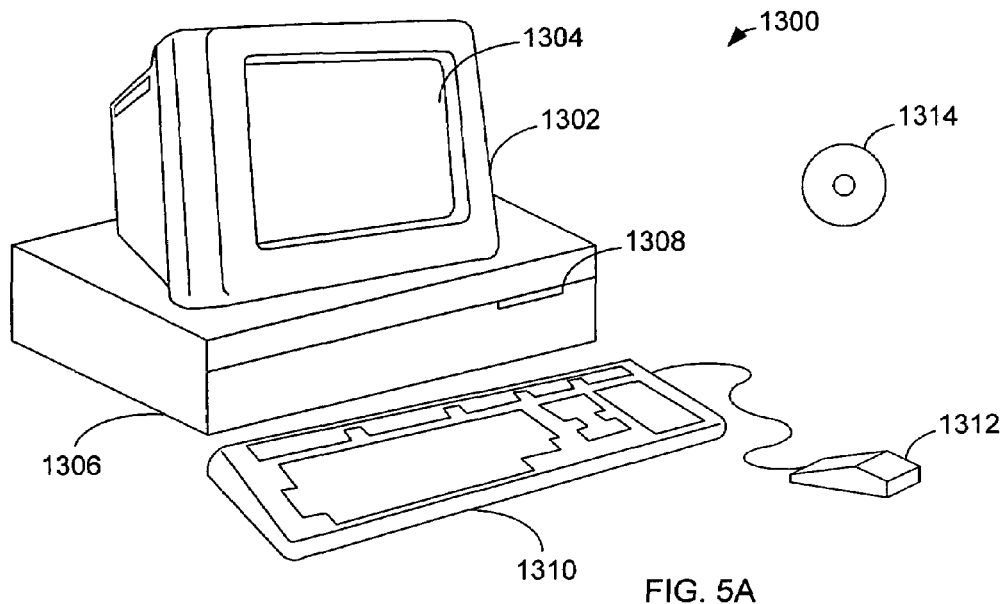
Figure 5B:
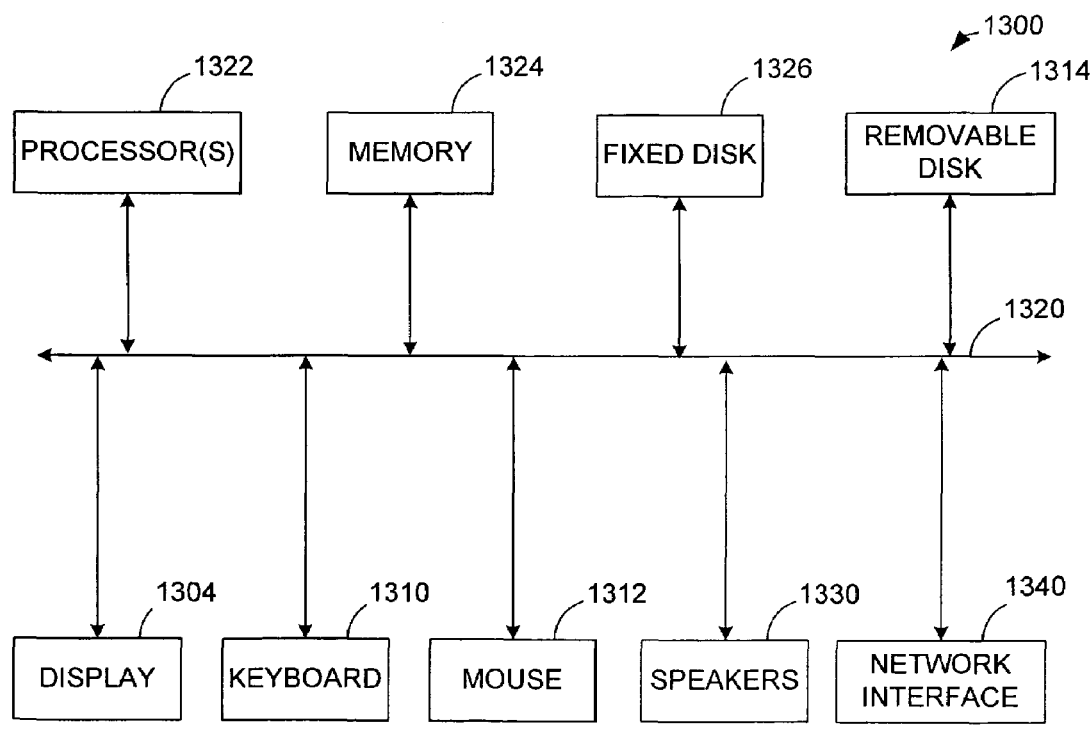

FIGS. 5A and 5B illustrate a computer system 1300, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 5B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

FIG. 3 is a more detailed flow chart of the step of shrinking the widths of the features in the sacrificial layer (step 116). As shown in FIG. 3, the shrinking the features comprises a plurality of cycles of a cyclic process comprising a shrink deposition phase (step 304) and profile shaping phase (step 308).

Preferably, the shrink deposition phase (step 304) uses a deposition gas comprising at least one of a combination of $CF_4$ and $H_2$ or a combination of $CH_3F$ and $N_2$ or $C_xF_y$ or $C_xH_yF_z$ with an oxidizing or reducing additive such as hydrogen, nitrogen, or oxygen, and carrier gases such as He, Ar, Ne, Kr, Xe etc. More generally, the deposition gas comprises at least one of hydrocarbon, fluorocarbon, and hydrofluorocarbon. More preferably, the deposition gas further comprises a carrier gas, such as argon or xenon. More preferably, the deposition gas further comprises at least one of an oxidizing additive and a reducing additive, such as $O_2$, $H_2$, or $NH_3$.

An example of a shrink deposition phase (step 304) provides a flow of 150 sccm $CH_3F$, 75 sccm $N_2$, and 100 sccm Ar. The pressure is set to 80 mTorr. The substrate is maintained at a temperature of 20° C. The second RF source 448 provides 400 Watts at a frequency of 27 MHz and 0 Watts a frequency of 2 MHz. During the deposition phase the deposition gas is provided, the deposition gas is transformed into a plasma, and then the deposition gas is stopped.

Preferably, the shrink profile shaping stage uses a profile shaping gas different from the deposition gas and comprising at least one of $C_xF_y$ and $NF_3$ and $C_xH_yF_z$. More preferably, the profile shaping gas further comprises a carrier gas, such as argon or xenon. More preferably, the profile shaping gas further comprises at least one of an oxidizing additive and a reducing additive, such as $O_2$, $H_2$, or $NH_3$.

An example of the shrink profile shaping phase (step 308) provides a halogen (i.e. fluorine, bromine, chlorine) containing gas, such as 100 sccm $CF_4$. In this example, $CF_4$ is the only gas provided during the profile shaping. A pressure of 20 mTorr is provided to the chamber. The second RF source 448 provides 600 Watts at a frequency of 27 MHz and 0 Watts a frequency of 2 MHz. During the profile shaping phase the profile shaping gas is provided, the profile shaping gas is transformed into a plasma, and then the profile shaping gas is stopped.

Preferably, the process is performed for between 2 to 20 cycles. More preferably, the process is performed between 3 to 10 cycles. The combination of deposition and profile shaping over a plurality of cycles allows for the formation of vertical sidewalls for the shrink. Preferably, the vertical sidewalls are sidewalls that from bottom to top make an angle between 88° to 90° with the bottom of the sacrificial layer feature.

Preferably, the shrink sidewalls cause widths of the sacrificial layer features to be reduced by between 5-80%. More preferably, the shrink sidewalls cause the widths of the sacrificial layer features to be reduced by between 5-50%. The cyclical cycle may have additional deposition and/or shaping phases or may have other additional phases.

In another embodiment, the shrink may be made of features in the photoresist mask before the sacrificial layer is etched. In such a case, the etching of the sacrificial layer and the dielectric layer may be done in a single step or in separate steps.

Figure 2E:
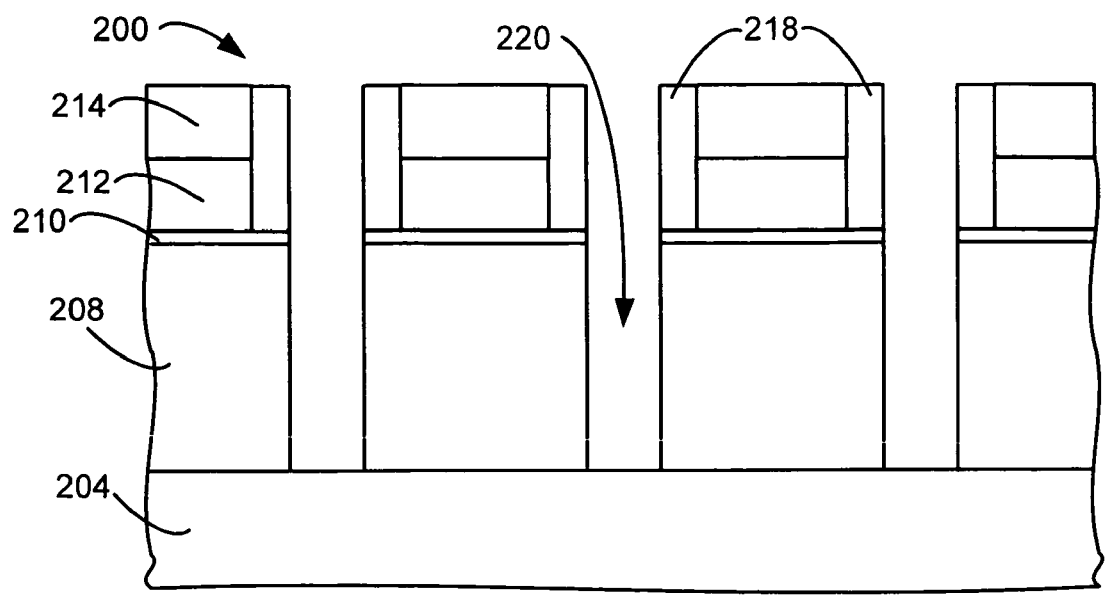

Features 220 of a first set of features are then etched into the dielectric layer 208 through the shrunken features in the sacrificial layer and patterned mask 214 the (step 120), as shown in FIG. 2E. A conventional dielectric etch is used.

Figure 2F:
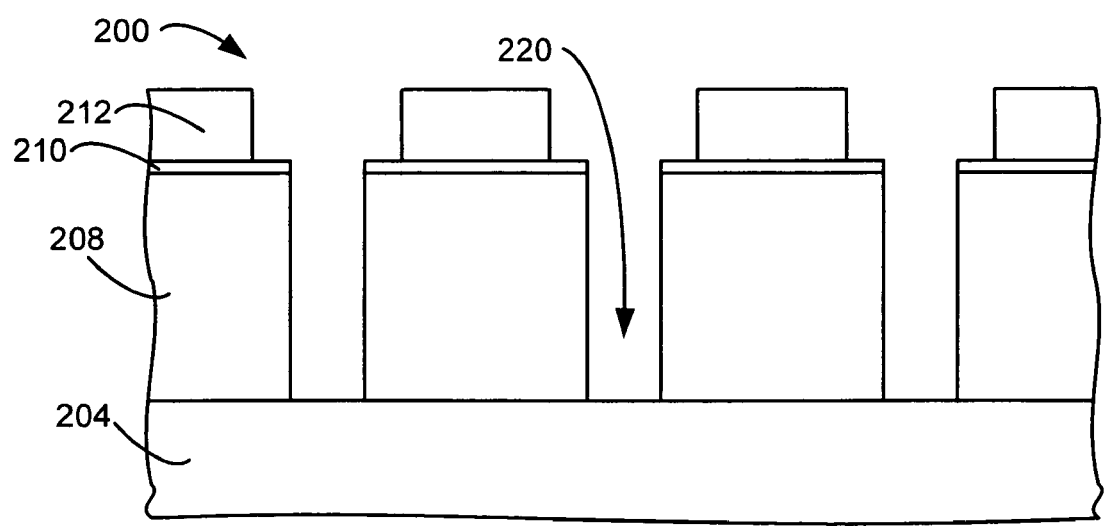

The patterned mask and shrink sidewall is stripped (step 124), as shown in FIG. 2F. The removal of the mask and shrink sidewall may be a single step or multiple step process. An ashing process may be used during this step.

Figure 2G:
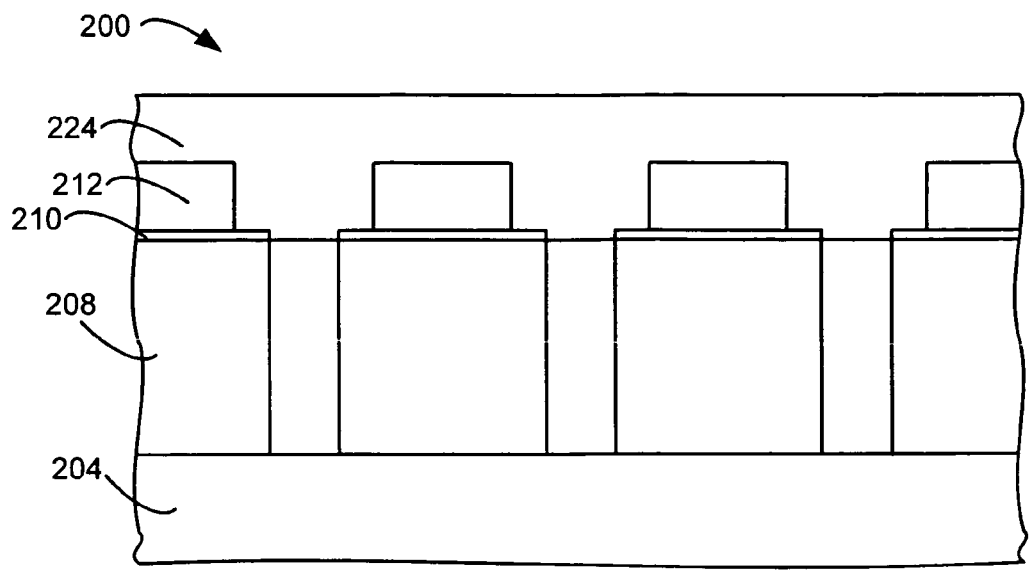

The features are then filled with a filler material 224 (step 128), as shown in FIG. 2G. In this embodiment the filler material is a polymer material, such as photoresist, hydrocarbons, doped hydrocarbons, such as fluorinated hydrocarbons, amorphous carbon, and diamond-like carbon. In the specification and claims, amorphous carbon and diamond-like carbon are polymer-like material with less hydrogen than regular polymer. Generally, the filler materials may be described as $H_xC_y$, $H_xC_yF_z$, and $H_xC_ySi_z$. More generally, the filler material may be described as any combination of C, H, F and an impurity of Si or other impurities. In this embodiment, the filler material is a polymer material formed by at least one of a spin on, PECVD (plasma-enhanced chemical vapor deposition), and LPCVD (low pressure chemical vapor deposition) process.

Figure 2H:
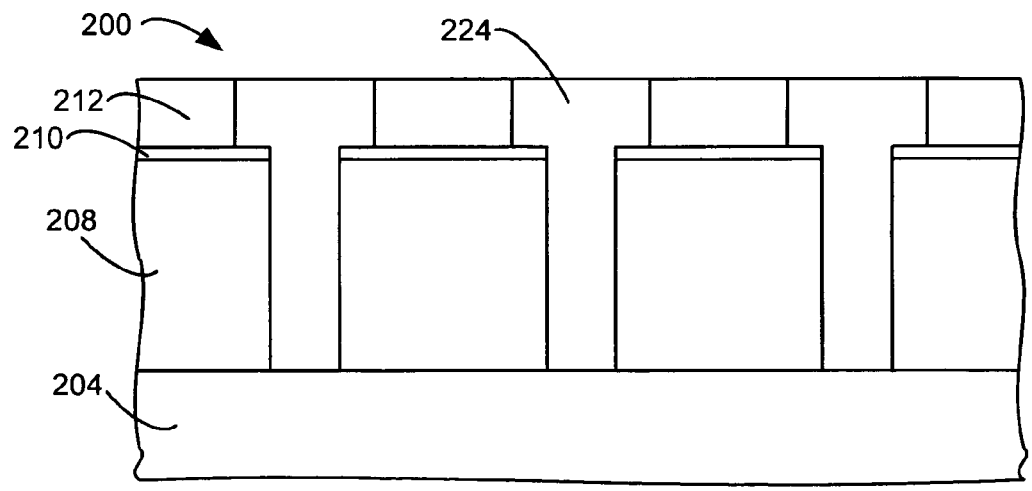

The filler material 224 is planarized (step 132) as shown in FIG. 2H. The planarization may be performed by processes such as chemical mechanical polishing (CMP) or etching back. In this embodiment, the planarization is used to expose the sacrificial layer 212.

In an alternative embodiment, a cyclical process of deposition and shaping phases may be used to fill the features with a filler material and planarize and expose the sacrificial layer in a single step. Other processes may be used to replace steps 128 and 132 with a single step.

Figure 2I:
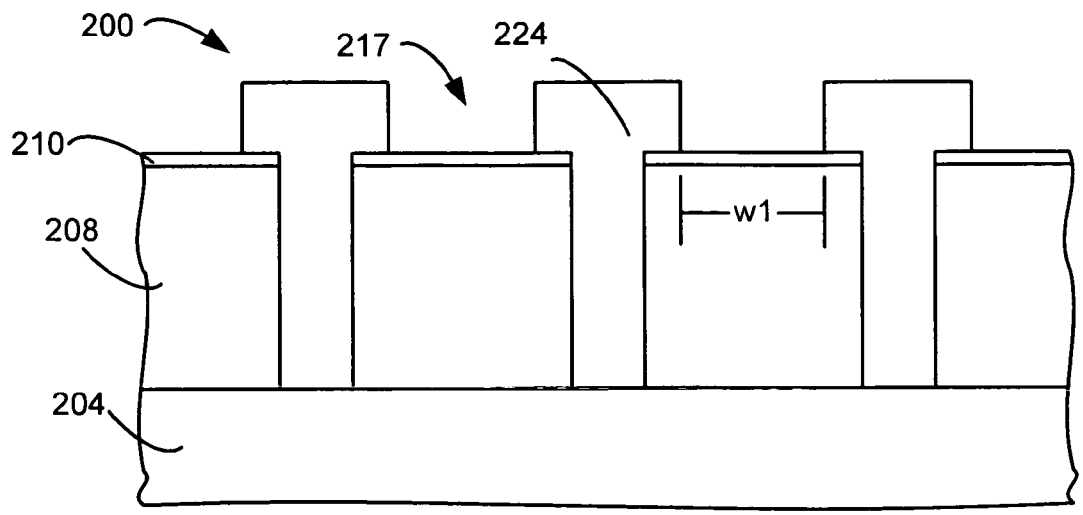

The sacrificial layer is removed (step 136), as shown in FIG. 2I. The planarization of the filler material 224 to expose the sacrificial layer 212 allows for the removal of the sacrificial layer. A selective etch process may be used to selectively remove the sacrificial layer without removing the filler material 224. An etch chamber 400, as shown in FIG. 4, may be used to accomplish this. In this example, a hydrogen fluoride (HF) wet etch (dip) is used to remove the silicon oxide sacrificial layer.

As a result of the removal of the sacrificial layer, parts of the filler material 224 extend above the surface of the dielectric layer 208, where spaces 217 are formed between the parts of the filler material 224 that extend above the surface of the dielectric layer 208, where the spaces 217 are in the area formerly occupied by the sacrificial layer. The spaces 217 have widths "w1", as shown in FIG. 2I. To remove the sacrificial layer without removing the filler material 224 or dielectric layer 208, the sacrificial layer must be a material that may be removed without removing the filler material 224 or the dielectric layer 208.

Figure 2J:
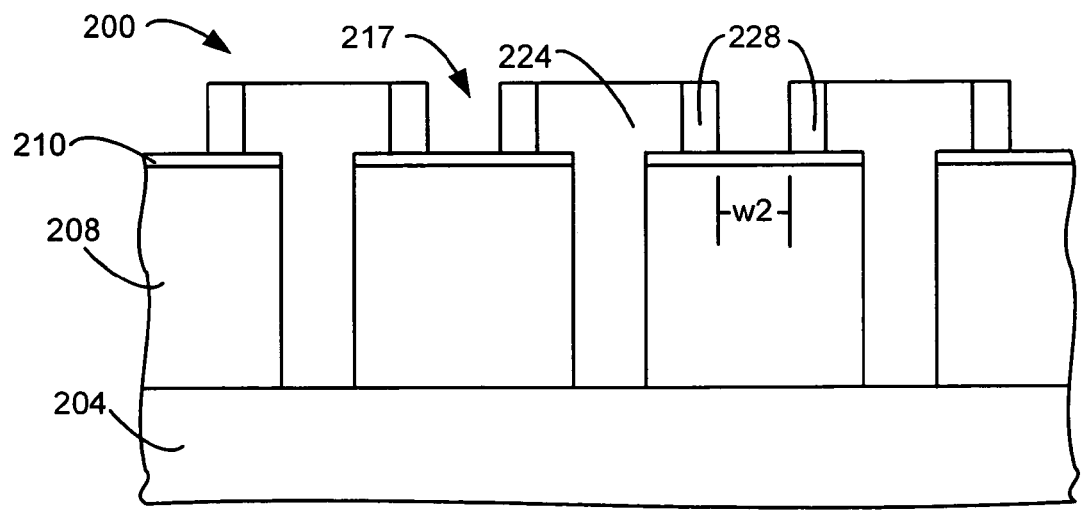

The spaces between the polymer material 224 are shrunk (step 140), as shown in FIG. 2J, by forming shrink sidewalls 228 on the sides walls of the exposed filler material 224 to form reduced spaces 232 with reduced widths "w2". The forming the shrink sidewalls 228 to form reduced spaces may be performed by placing the substrate in a processing chamber. In addition, the shrink process may be a multistep cyclical process, as described above with regard to the previous shrink process.

Figure 2K:
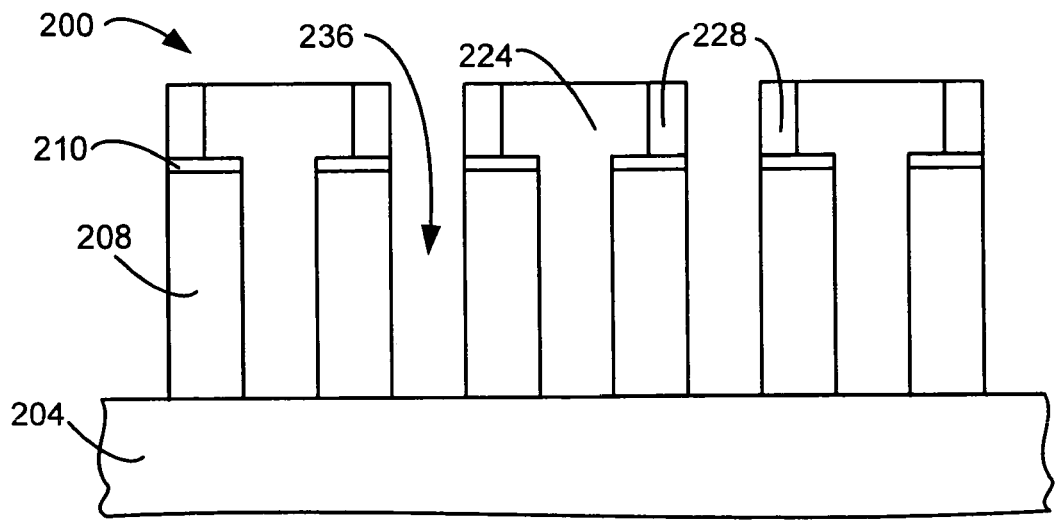

Features 236 of a second set of features are etched into the dielectric layer 208 through the reduced spaces between the shrink sidewalls 228, as shown in FIG. 2K. A conventional etch recipe for etching the dielectric layer 208 is used.

Figure 2L:
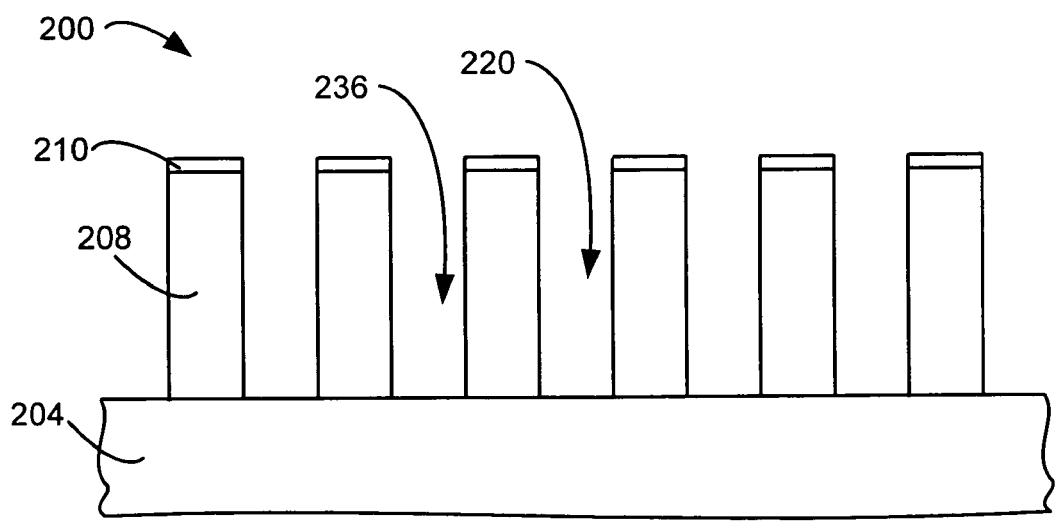

The filler material and shrink sidewall of the filler material are removed (step 148) as shown if FIG. 2L with features 220 of a first set of features and features 236 of a second set of features.

The table below provides various combinations of sacrificial layer materials and filler materials. Duo is a hydrocarbon material with silicon. The organic polymer may be amorphous carbon, photoresist, or bottom antireflective coating (BARC). The combinations allow the sacrificial layer to be selectively removed with respect to the filler material and dielectric layer using either a plasma etch or wet strip and the filler material to be selectively removed with respect to the dielectric layer using an oxidizing, reducing, or wet strip.

| Sacrificial materials | Filler materials |
| --- | --- |
| SiN | Organic Polymer or TEOS |
| a-Si | Organic Polymer |
| TEOS | Organic Polymer |
| Duo | Organic Polymer |
| SiC | Organic Polymer |
| a-Si | Duo |
| TiN | Organic Polymer |
| TaN | Organic Polymer |

In this example, an $O_2$ plasma strip is used to remove the polymer filler material.

In this example, individual features 220 of the first set of features are between features 236 of the second set of features and where features 236 of the second set of features are between features 220 of the first set of features, so that features alternate between, a feature 220 of the first set of features and a feature 236 of the second set of features. In addition, features 220 of the first set of features are separated from features 236 of the second set of features by the dielectric material of the dielectric layer.

Additional steps, such as filling the features with a conductive material may be provided.

This process provides etched features with half the CD and half the pitch of features formed using the same photoresist mask using a conventional etch process. This process allows the use of a single photoresist mask to halve the pitch, while providing an automatic alignment between the first set of features and the second set of features.

Some of the steps in the above preferred embodiment may be omitted or changed without increasing CD and/or increasing the pitch. Other steps in the preferred embodiment may be omitted or changed, but which still reduces the CD and/or reduces pitch with respect to conventional processes.

In other embodiments, the process is repeated using additional masks to further reduce CD and reduce the pitch. For an example, a second mask may be used for another half pitch reduction.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method providing features in a dielectric layer, comprising:
    forming a sacrificial layer over the dielectric layer;
    forming a patterned mask over the sacrificial layer;
    etching a set of sacrificial layer features into the sacrificial layer;
    shrinking the sacrificial layer features by forming a shrink deposition;

etching a first set of dielectric layer features into the dielectric layer through the sacrificial layer;

filling the features of the first set of dielectric layer features and the set of sacrificial layer features with a filler material;

removing the sacrificial layer, so that parts of the filler material remain exposed above a surface of the dielectric layer, wherein spaces are between the exposed parts of the filler material, where the spaces are in an area formerly occupied by the sacrificial layer, wherein the spaces have widths;

shrinking the widths of the spaces between the parts of the filler material with a shrink sidewall deposition;

etching a second set of dielectric layer features into the dielectric layer through the shrink sidewall deposition; and removing the filler material and shrink sidewall deposition.

2. The method, as recited in claim 1, further comprising removing the shrink deposition after etching the first set of dielectric layer features.

3. The method, as recited in claim 2, wherein the removing the shrink deposition is before filling the features of the first set of dielectric layer features and the set of sacrificial layer features with the filler material.

4. The method, as recited in claim 3, further comprising planarizing the filler material.

5. The method, as recited in claim 4, wherein the shrinking the widths of the spaces comprises at least one shrink cycle, wherein each shrink cycle comprises:
   a shrink deposition phase, which forms deposits on sidewalls of the filler material to shrink the spaces; and
   a shrink profile shaping phase, which shapes the deposition on the sidewalls of the filler material.

6. The method, as recited in claim 5, wherein the shrink deposition phase comprises:
   providing a deposition gas;
   forming a plasma from the deposition gas; and
   stopping the flow of the deposition gas.

7. The method, as recited in claim 5, wherein the shrink profile shaping phase comprises:
   providing a profile shaping gas different than the deposition gas;
   forming a plasma from the profile shaping gas; and
   stopping the flow of the profile shaping gas.

8. The method, as recited in claim 7, wherein the deposition gas comprises at least one of a hydrocarbon, fluorocarbon, and hydrofluorocarbon and the profile shaping gas comprises at least one of $C_xF_y$, $NF_3$, and $C_xH_yF_z$.

9. The method, as recited in claim 8, wherein the shrinking the sacrificial layer features comprises at least one shrink cycle, wherein each shrink cycle comprises:
   a shrink deposition phase, which forms deposits on sidewalls of the sacrificial layer to shrink the sacrificial layer features; and
   a shrink profile shaping phase, which shapes the deposition on the sidewalls of the sacrificial layer features.

10. The method, as recited in claim 9, wherein the shrink deposition phase comprises:
    providing a deposition gas;
    forming a plasma from the deposition gas; and
    stopping the flow of the deposition gas.

11. The method, as recited in claim 10, wherein the shrink profile shaping phase comprises:
    providing a profile shaping gas, which is different than the deposition gas;
    forming a plasma from the profile shaping gas; and
    stopping the flow of the profile shaping gas.

12. The method, as recited in claim 11, wherein the deposition gas comprises at least one of a hydrocarbon, fluorocarbon, and hydrofluorocarbon and the profile shaping gas comprises at least one of $C_xF_y$, $NF_3$, $C^xH^yF^z$.

13. The method, as recited in claim 12, further comprising filling the features with a conductive material.

14. The method, as recited in claim 2, wherein the shrinking the sacrificial layer features comprises at least one shrink cycle, wherein each shrink cycle comprises:
    a shrink deposition phase, which forms deposits on sidewalls of the sacrificial layer to shrink the sacrificial layer features; and
    a shrink profile shaping phase, which shapes the deposition on the sidewalls of the sacrificial layer features.

15. The method, as recited in claim 1, further comprising providing an etch stop layer between the sacrificial layer and the dielectric layer.

16. The method, as recited in claim 1, wherein the shrinking the widths of the spaces comprises at least one shrink cycle, wherein each shrink cycle comprises:
    a shrink deposition phase, which forms deposits on sidewalls of the filler material to shrink the spaces; and
    a shrink profile shaping phase, which shapes the deposition on the sidewalls of the filler material.

17. A method providing features in a dielectric layer, comprising:
    forming a sacrificial layer over the dielectric layer;
    forming a patterned mask over the sacrificial layer;
    etching a set of sacrificial layer features into the sacrificial layer;
    shrinking the sacrificial layer features by forming a shrink deposition, comprising at least one cycle, wherein each cycle comprises:
      a shrink deposition phase, which forms deposits on sidewalls of the sacrificial layer features to shrink the sacrificial layer features; and
      a shrink profile shaping phase, which shapes the deposition on the sidewalls of the sacrificial layer features;
    etching a first set of dielectric layer features into the dielectric layer through the shrink deposition;
    removing the shrink deposition;
    filling the features of the first set of dielectric layer features and the set of sacrificial layer features with a filler material;
    removing the sacrificial layer, so that parts of the filler material remain exposed above a surface of the dielectric layer, wherein spaces are between the exposed parts of the filler material,
    where the spaces are in an area formerly occupied by the sacrificial layer, wherein the spaces have widths;
    shrinking the widths of the spaces between the parts of the filler material with a shrink sidewall deposition, wherein the shrinking the widths of the spaces comprises at least one shrink cycle, wherein each shrink cycle comprises:
      a shrink deposition phase, which forms deposits on sidewalls of the filler material to shrink the spaces; and
      a shrink profile shaping phase, which shapes the deposition on the sidewalls of the filler material;
    etching a second set of dielectric layer features into the dielectric layer through the shrink sidewall deposition; and
    removing the filler material and shrink sidewall deposition.

* * * * *